United States Patent
Sakatani et al.

(10) Patent No.: US 8,345,444 B2
(45) Date of Patent: Jan. 1, 2013

(54) STRUCTURE WITH ELECTRONIC COMPONENT MOUNTED THEREIN AND METHOD FOR MANUFACTURING SUCH STRUCTURE

(75) Inventors: Shigeaki Sakatani, Osaka (JP); Koso Matsuno, Osaka (JP); Atsushi Yamaguchi, Osaka (JP); Hidenori Miyakawa, Osaka (JP); Mikiya Ueda, Hyogo (JP)

(73) Assignee: Panasonic Corporation, Osaka (JP)

( * ) Notice: Subject to any disclaimer, the term of this patent is extended or adjusted under 35 U.S.C. 154(b) by 407 days.

(21) Appl. No.: 12/675,080

(22) PCT Filed: Oct. 21, 2008

(86) PCT No.: PCT/JP2008/002975
§ 371 (c)(1),
(2), (4) Date: Feb. 24, 2010

(87) PCT Pub. No.: WO2009/057259
PCT Pub. Date: May 7, 2009

(65) Prior Publication Data
US 2011/0110050 A1    May 12, 2011

(30) Foreign Application Priority Data

Nov. 1, 2007  (JP) ................ 2007-284975
Nov. 8, 2007  (JP) ................ 2007-290308

(51) Int. Cl.
*H05K 1/11* (2006.01)
(52) U.S. Cl. ........ 361/803; 361/748; 174/260; 174/262; 174/265; 174/266
(58) Field of Classification Search .......... 361/803, 361/784, 748, 746, 749; 174/260, 262, 265, 174/266; 257/777, 778, 686
See application file for complete search history.

(56) References Cited

U.S. PATENT DOCUMENTS

| | | | |
|---|---|---|---|
| 5,101,324 A | | 3/1992 | Sato |
| 5,477,082 A | * | 12/1995 | Buckley et al. ............... 257/679 |
| 6,229,215 B1 | | 5/2001 | Egawa |
| 6,404,062 B1 | * | 6/2002 | Taniguchi et al. ............. 257/778 |
| 6,519,844 B1 | * | 2/2003 | Nagarajan et al. ............. 29/841 |
| 6,680,435 B1 | * | 1/2004 | Ogawa et al. .................. 174/535 |

(Continued)

FOREIGN PATENT DOCUMENTS

| | | |
|---|---|---|
| JP | 03-020051 | 1/1991 |
| JP | 09-027583 | 1/1997 |
| JP | 09-027583 A | 1/1997 |
| JP | 2914569 | 7/1999 |
| JP | 11-312712 | 11/1999 |

(Continued)

OTHER PUBLICATIONS

Chinese Office Action issued in Chinese Patent Application No. 200880109758.1, mailed Mar. 24, 2011.

*Primary Examiner* — Hoa C Nguyen
(74) *Attorney, Agent, or Firm* — McDermott Will & Emery LLP

(57) ABSTRACT

A structure with electronic component mounted therein includes a wiring board on which an electronic component is mounted at least on its first face, resin provided at least between the electronic component and the wiring board, and a plurality of holes formed in the wiring board at region corresponding to a mounting position of the electronic component. The holes are filled with the resin. This suppresses warpage of the structure with electronic component mounted therein, and also improves reliability by reducing a stress applied to a bonding section between the wiring board and the electronic component.

14 Claims, 13 Drawing Sheets

U.S. PATENT DOCUMENTS

| | | | | |
|---|---|---|---|---|
| 7,394,148 B2* | 7/2008 | Karnezos | ............... | 257/686 |
| 7,700,414 B1* | 4/2010 | San Antonio et al. | ........ | 438/118 |
| 2002/0173074 A1* | 11/2002 | Chun-Jen et al. | ............. | 438/108 |
| 2004/0090759 A1* | 5/2004 | Kim | ............... | 361/790 |
| 2007/0216007 A1* | 9/2007 | Lee et al. | ............... | 257/686 |
| 2008/0041615 A1* | 2/2008 | Zhong et al. | ............... | 174/255 |
| 2008/0264681 A1* | 10/2008 | Iwai et al. | ............... | 174/257 |
| 2009/0016671 A1* | 1/2009 | Asai et al. | ............... | 385/14 |

FOREIGN PATENT DOCUMENTS

| | | |
|---|---|---|
| JP | 3260249 | 2/2002 |
| JP | 2003-008233 | 1/2003 |
| JP | 2004-023045 | 1/2004 |
| JP | 2006-286782 | 10/2006 |
| JP | 2007-134448 | 5/2007 |
| KR | 10-2007-0010312 | 1/2007 |

* cited by examiner

STRUCTURE WITH ELECTRONIC COMPONENT MOUNTED THEREIN AND METHOD FOR MANUFACTURING SUCH STRUCTURE

RELATED APPLICATIONS

This application is the U.S. National Phase under 35 U.S.C. §371 of International Application No. PCT/JP2008/002975, filed on Oct. 21, 2008, which in turn claims the benefit of Japanese Application Nos. 2007-284975, filed on Nov. 1, 2007 and 2007-290308, filed on Nov. 8, 2007, the disclosures of which Applications are incorporated by reference herein.

TECHNICAL FIELD

The present invention relates to a structure with an electronic component mounted therein, in which an electronic component such as a semiconductor chip is mounted on a wiring board; and methods for manufacturing such a structure.

BACKGROUND ART

Electronic circuits are rapidly becoming more multi-functioned, smaller, and lighter. In line with this trend, smaller, lighter, and thinner packages of semiconductor chips or the like and their mounting methods are also demanded.

To satisfy these demands, a flip-chip mounting technology is widely adopted, instead of wire-bonding technology, in technologies for mounting semiconductor chips on a wiring board. The flip-chip technology is to form projecting electrodes, using solder or Au wire, on the surface of a semiconductor chip and connect these electrodes to a wiring board. In this technology, in general, a semiconductor chip is mounted, via projecting electrodes, on one side of a wiring board with a wiring pattern, and resin called underfill is filled between the semiconductor chip and the wiring board, so as to integrate and fix the semiconductor chip onto the wiring board.

Since the semiconductor chip and the wiring board are integrated using resin, warpage occurs consistently or repeatedly due to heat treatment during production or external ambient temperature during use if a thermal expansion coefficient differs between the semiconductor chip and the wiring board.

To solve this warpage problem, a double-sided mounting method for chip mounting boards is disclosed. (For example, refer to Patent Literature 1.) The double-sided mounting method disclosed in Patent Literature 1 includes the first step of mounting the semiconductor chip on one face of the wiring board and curing underfill resin between the wiring board and the semiconductor chip, and the second step of mounting a semiconductor chip on the other face of the wiring board and curing underfill resin between the wiring board and the semiconductor chip. The use of underfill resin with different thermal expansion coefficients in the first step and the second step prevents warpage of the chip-mounted board.

However, the use of different types of underfill resin in Patent Literature 1 results in restrictions to flexibility in material designs. In addition, since steps of placing a semiconductor chip, injecting underfill resin, and curing underfill resin need to be implemented separately for the surface and the rear face of the wiring bard, the assembly time approximately doubles, decreasing the productivity. Accordingly, a technology for both improving productivity and suppressing warpage has been demanded. Still more, a temperature for canceling the warpage occurred in assembly processes may not be an optimal temperature for curing underfill resin. If the temperature is not optimal, curing of underfill resin may take longer time, curing of underfill resin may not be achieved, or contrarily, curing time may be too short. As a result, voids are produced in the underfill resin, and reliability reduces due to degradation in moisture resistance or bonding strength.

Still more, a mounting method for a structure with electronic component mounted therein and the mounting structure are disclosed. (For example, refer to Patent Literature 2.) In Patent Literature 2, the structure with electronic component mounted therein is mounted facing down on a wiring board with fine holes via liquid resin composite containing inorganic filler with the size larger than the holes. Since only resin in the liquid resin composite is filled in the holes, warpage of the structure with electronic component mounted therein is prevented, depending on an amount of resin filled in the holes, by adjusting thermal expansion coefficients of the resin composite between the electronic component and the wiring board.

Furthermore, a semiconductor device in which a semiconductor chip is mounted on both faces of a carrier tape with holes penetrating through is disclosed. (For example, refer to Patent Literature 3 and Patent Literature 4.) In Patent Literature 3 and Patent Literature 4, resin is filled between opposing semiconductor chips in a single step via a hole penetrating through, and the resin improves the sealing strength.

In the above Patent Literature 3, warpage of overall semiconductor device is effectively prevented when semiconductor chips are mounted on both faces of carrier tape. However, it is difficult to reduce a stress concentrated on a bonding section between an electrode of semiconductor chip and an electrode of tape carrier caused by difference in thermal expansion coefficients. Therefore, the stress concentrates on the bonding section by a change in external ambient temperature. This causes a crack, breakage, or peeling in the bonding section, reducing the reliability.

In Patent Literature 4, warpage of semiconductor device is prevented by optimizing the filling sequence of underfill resin injected to semiconductor chips with different sizes mounted on both faces. In addition, the underfill resin can be efficiently filled via the holes penetrating through. However, same as Patent Literature 3, it is also difficult to reduce a stress concentrated on a bonding section in Patent Literature 4.

Patent Literature 1: Japanese Patent Unexamined Publication No. 2004-23045

Patent Literature 2: Japanese Patent Unexamined Publication No. 3260249

Patent Literature 3: Japanese Patent Unexamined Publication No. H3-20051

Patent Literature 4: Japanese Patent Unexamined Publication No. 2007-134448

SUMMARY OF THE INVENTION

A structure with electronic component mounted therein of the present invention includes a wiring board on which an electronic component is mounted at least on its first face, resin provided at least between the electronic component and the wiring board, and a plurality of holes formed in the wiring board in a region corresponding to a mounting position of the electronic component. The holes are filled with the resin.

This configuration suppresses warpage caused by a difference in thermal expansion coefficients of the wiring board and the electronic component, and also reduces a stress applied to a bonding section between the wiring board and the electronic component. This achieves a highly-reliable structure with electronic component mounted therein.

A method for manufacturing the structure with electronic component mounted therein of the present invention includes the steps of forming a plurality of holes in the wiring board in a region corresponding to a mounting position of the electronic component; mounting the electronic component at least on the first face of the wiring board in the region corresponding to the mounting position of the electronic component; and applying resin at least between the electronic component and the wiring board, and filling the holes with the resin.

This method suppresses warpage caused by a difference in thermal expansion coefficients between the resin and the electronic component, and also reduces a stress applied to the bonding section between the wiring board and the electronic component. Accordingly, a highly-reliable structure with electronic component mounted therein can be easily manufactured.

REFERENCE MARKS IN THE DRAWINGS

| | |
|---|---|
| 1, 51A, 51B | Wiring board |
| 1A | First face |
| 1B | Second face |
| 2 | Hole |
| 3 | Resin |
| 4 | Electronic component |
| 4A | Region |
| 5 | Solder |
| 6, 6A, 6B, 8A | Cavity |
| 7 | Dispenser |
| 8 | Holder |
| 10, 20, 30, 40, 50, 60, 70, 80, 100 | Structure with electronic component mounted therein (also referred to as "mounting structure") |
| 14 | First electronic component |
| 24 | Second electronic component |
| 50A | First structure with electronic component mounted therein (also referred to as "first mounting structure") |
| 50B | Second structure with electronic component mounted therein (also referred to as "second mounting structure") |
| 52 | Connecting member |

DETAILED DESCRIPTION OF PREFERRED EMBODIMENTS

Exemplary embodiments of the present invention are described below with reference to drawings. Same components may be given the same reference marks to omit duplicate description.

(First Exemplary Embodiment)

Figure 1A:
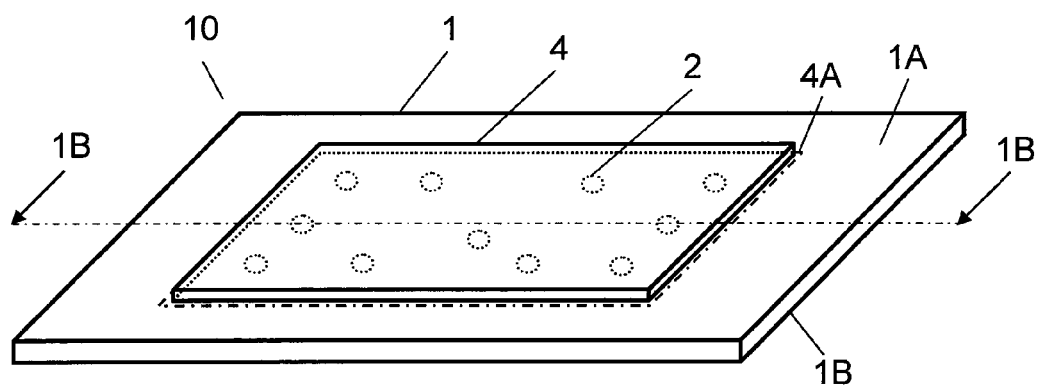
FIG. 1A is an appearance perspective view of a structure with electronic component mounted therein in accordance with a first exemplary embodiment of the present invention.
Figure 1B:
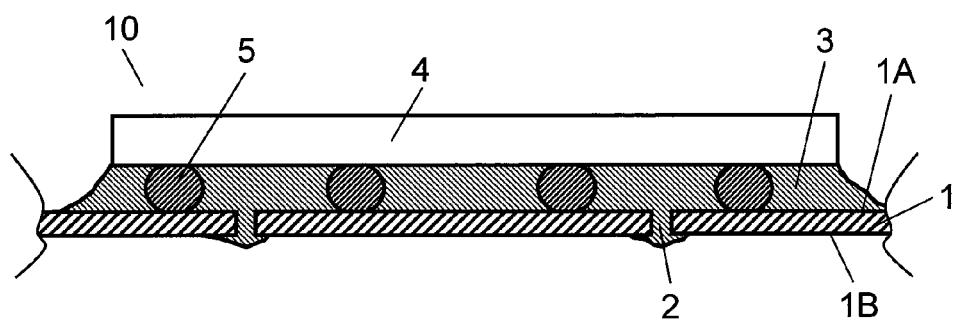
FIG. 1B is a sectional view taken along line 1B-1B in FIG. 1A.

FIG. 1A is an appearance perspective view illustrating configuration of a structure with electronic component mounted therein (hereafter referred to as a "mounting structure") in the first exemplary embodiment, and FIG. 1B is a sectional view taken along line 1B-1B in FIG. 1A. For easier understanding, FIG. 1A is partially made transparent.

As shown in FIGS. 1A and 1B, mounting structure 10 includes electronic component 4 mounted at least on first face 1A of wiring board 1, solder 5 for electrically connecting electronic component 4 and wiring board 1, and resin 3 for bonding electronic component 4 and wiring board 1. Resin 3 is what is generally called underfill resin.

As shown in FIG. 1B, a pad (not illustrated) of electronic component 4 and an electrode (not illustrated) of wiring board 1 are connected via solder 5 so that electronic component 4 is electrically connected to a wiring pattern (not illustrated) of wiring board 1.

Wiring board 1 has a plurality of holes 2 penetrating through from first face 1A of wiring board 1 to second face 1B on the opposite side of first face 1A in region 4A (an area surrounded by a dot-dashed line in the drawing) corresponding to a mounting position of electronic component 4. Holes 2 are filled with resin 3 that bonds electronic component 4 onto wiring board 1. Resin 3 also reaches second face 1B of wiring board 1, and protrudes to around holes 2. Volume of resin 3 protruding on second face 1B of wiring board 1 is not particularly limited, but is preferably double or more of a diameter (size) of hole 2.

As wiring board 1, for example, a single-layer or multilayer glass epoxy board of high Tg (glass-transition temperature) type with low linear expansion coefficient, or a flexible board made of polyethylene terephthalate (PET) resin or polyimide resin or the like is used. The flexible board is more flexible than the glass epoxy board, and thus can flexibly respond to behavior of resin such as shrinkage at curing. Accordingly, the flexible board is particularly preferable for the wiring board.

As resin 3, for example, epoxy resin including filler such as 55% glass inorganic filler with coefficient of elasticity of 3 GPa, glass-transition temperature of 150° C. (measured based on dynamic viscoelasticity), and average particle size of 2 μm is used. The glass-transition temperature of resin 3 is preferably lower than the glass-transition temperature of wiring board 1. This is because electronic component 4, such as a semiconductor chip, generally has a high glass-transition temperature, and thus electronic component 4 does not soften by the resin curing temperature. Therefore, if the glass-transition temperature of wiring board 1 is lower than the glass-transition temperature of resin 3, wiring board 1 softens faster than resin 3, and tends to cause warpage. However, since resin 3 is not yet softened, wiring board 1 cannot warp. This makes a stress concentrated on a portion of solder 5, which is a bonding section between wiring board 1 and electronic component 4, and tends to cause a crack or breakage. On the other hand, if the glass-transition temperature of wiring board 1 is higher than the glass-transition temperature of resin 3, resin 3 softens first, and then wiring board 1 softens. Accordingly, the concentration of stress can be significantly suppressed. In addition, the coefficient of elasticity of resin 3 is preferably smaller than the coefficient of elasticity of wiring board 1. This is because mounting structure 10 is configured by lamination in a sequence of electronic component 4, resin 3, and wiring board 1. Therefore, if the coefficient of elasticity of resin 3 is smaller than the coefficients of elasticity of wiring board 1 and electronic component 4, which means resin 3 is more flexible, warpage caused by a difference in thermal-expansion coefficients of wiring board 1 and electronic component 4 can be absorbed by deformation of resin 3.

As electronic component 4, for example, about 1 mm thick LGA (Land Grid Array) semiconductor package; a semiconductor package such as QFP (Quad Flat Package), TCP (Tape Carrier Package), and TSOP (Thin Small Outline Package); a bare semiconductor chip; and other general components are used. A wiring pattern may be provided in an inner layer of a multilayer board, in addition to first face 1A of wiring board 1, typically by connecting with a via hole (not illustrated).

In this configuration, resin 3 protruding on second face 1B of wiring board 1 sandwiches wiring board 1 when resin 3 shrinks, and thus warpage of entire wiring board 1 is suppressed. Still more, optimized hole 2 and resin 3 can reduce a stress concentrated on a boundary face of solder 5, which is a bonding section between wiring board 1 and electronic component 4, caused by a difference in their thermal-expansion coefficients.

This exemplary embodiment reduces a stress on the bonding section between the wiring board and the electronic component by optimizing a plurality of holes and resin provided in the wiring board. This achieves a mounting structure with good connection reliability. In addition, the resin filled in the holes that penetrate through suppresses warpage of the mounting structure, and achieves a thin mounting structure.

This exemplary embodiment refers to an example of improving the heat characteristic by adding a filler component to the resin. However, the present invention is not limited to this arrangement. The filler may not be added. If the filler is added, the maximum particle size or the maximum length of filler is preferably smaller than a hole diameter (size). In particular, with consideration to easy-handling and a filling velocity at injecting the resin in between the wiring board and the electronic component, the maximum particle size of filler is preferably above 0 (zero), and not greater than ½, more preferably not greater than ¼, of the average diameter (size) of hole 2. If each hole is not round, the hole diameter (size) refers to the shortest distance of hole 2. This allows smooth filling up of holes 2 with the resin.

Furthermore, this exemplary embodiment refers to an example of forming the holes in the wiring board typically by laser beam. However, the present invention is not limited to this method. For example, through holes previously formed in wiring board 1 may be used as the holes. This simplifies a manufacturing method, and thus improves productivity. In addition, the resin filled in the through-holes prevents peeling or disconnection of metal plating foils electrically connected via through holes, which may occur by expansion or shrinkage of the wiring board.

A method for manufacturing the mounting structure in the first exemplary embodiment of the present invention is described below with reference to drawings.

Figure 2:
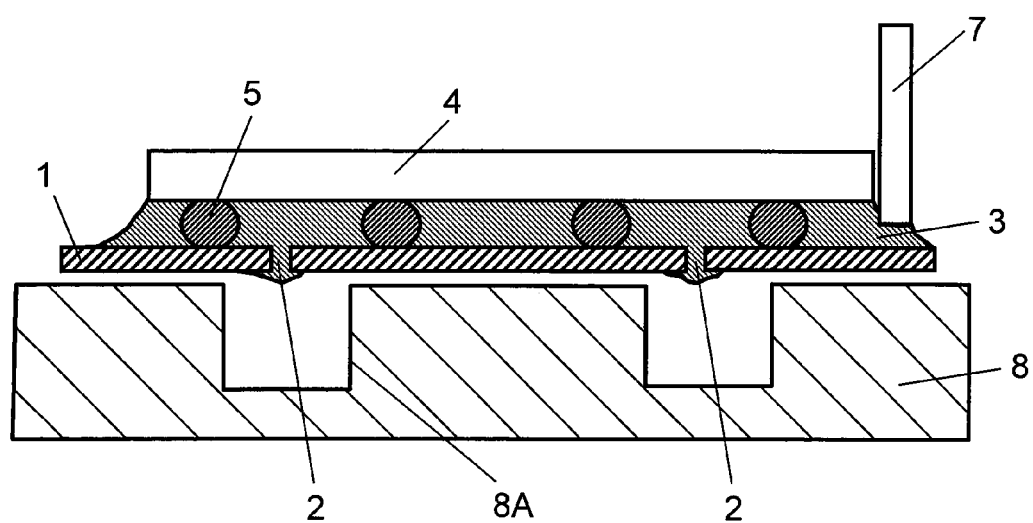
FIG. 2 is a sectional view illustrating a main part of a method for manufacturing the structure with electronic component mounted therein in accordance with the first exemplary embodiment of the present invention.

FIG. 2 is a sectional view illustrating a main part of the method for manufacturing the mounting structure in the first exemplary embodiment of the present invention. A general manufacturing method is only briefly mentioned in the following description.

First, a plurality of holes 2 are formed in a region (equivalent to 4A in FIG. 1A) corresponding to a mounting position of an electronic component in about 0.4 mm thick wiring board 1 typically made of a glass epoxy board. Holes 2 with outer diameter of 0.15 mm are formed typically by punching or laser beam.

Next, solder paste, such as Sn-3Ag.0.5Cu, is printed on an electrode (not illustrated) on wiring board 1. Then, electronic component 4, such as a semiconductor chip of LGA type with outer dimension of 12×17 mm and thickness of 1 mm, is placed with its pad (not illustrated) facing the electrode of wiring board 1. The pad is bonded onto the electrode by reflow soldering. Accordingly, electronic component 4 is mounted on wiring board 1 via solder 5.

Next, as shown in FIG. 2, wiring board 1, on which electronic component 4 is mounted, is placed on holder 8 that allows vacuum suction. Cavity 8A is provided at holder 8 at a position corresponding to the position of hole 2 in wiring board 1. Then, while wiring board 1 is retained on holder 8, dispenser 7 is typically used for injecting resin 3, such as epoxy resin, into a gap between wiring board 1 and electronic component 4 facing each other from the side face, for example, of electronic component 4.

After injecting resin 3, resin 3 is cured in a drying furnace at, for example, 150° C. to complete mounting structure 10.

Another example of the mounting structure in the first exemplary embodiment of the present invention is described below with reference to FIGS. 3A and 3B and FIGS. 4A to 4D. A method for manufacturing the mounting structure of this example is the same as the method for manufacturing mounting structure 10, and thus its description is omitted here.

Figure 3A:
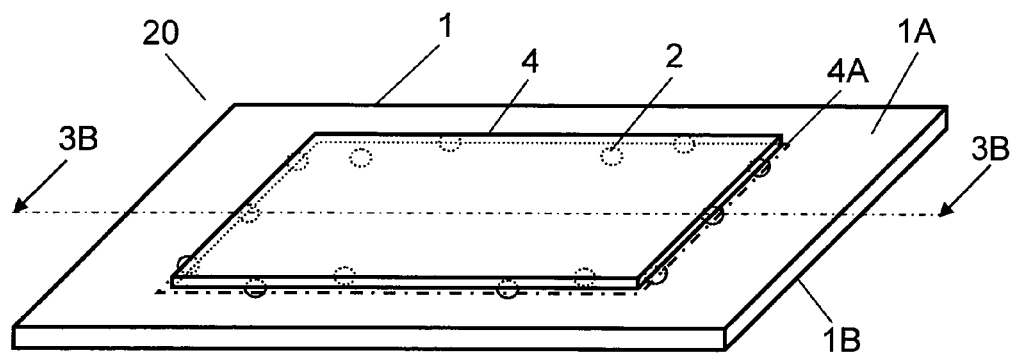
FIG. 3A is an appearance perspective view of a first example of the structure with electronic component mounted therein in accordance with the first exemplary embodiment of the present invention.
Figure 3B:
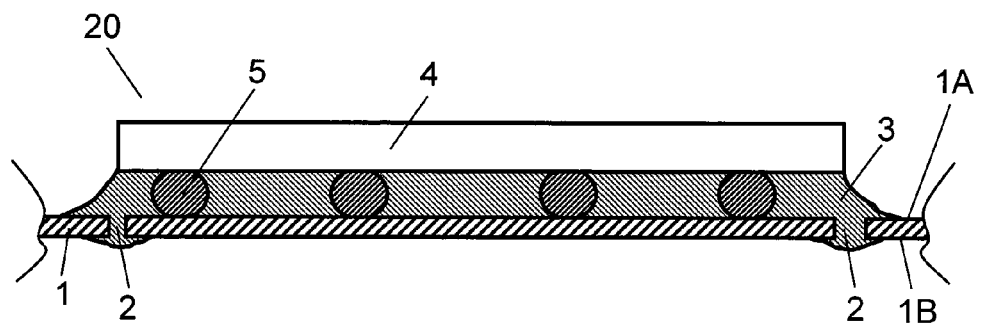
FIG. 3B is a sectional view taken along line 3B-3B in FIG. 3A.

FIG. 3A is an appearance perspective view of the first example of mounting structure 20 in the first exemplary embodiment of the present invention. FIG. 3B is a sectional view taken along line 3B-3B in FIG. 3A. For easier understanding, FIG. 3A is partially made transparent, same as FIG. 1A.

As shown in FIGS. 3A and 3B, mounting structure 20 provides holes 2 penetrating through from first face 1A to second face 1B of wiring board 1 near an outer edge of electronic component 4 in region 4A corresponding to a mounting position of electronic component 4. This point differs from mounting structure 10. Region 4A includes an area where resin 3 protrudes from the outer edge of electronic component 4 or an area where fillet is formed.

In other words, as shown in FIG. 3B, holes 2 are formed at an outer periphery from solder 5 connecting electronic component 4 and wiring board 1. Other configuration, materials, and manufacturing method are the same as that of mounting structure 10, and thus their description is omitted.

This configuration effectively reduces a stress concentrated on the bonding section. This also suppresses peeling of the electronic component and wiring board at an outer edge due to warpage or external deformation, further improving reliability. The resin protruding on second face 1B of wiring board 1 from hole 2 is assumed to improve the bonding strength.

Figure 4A:
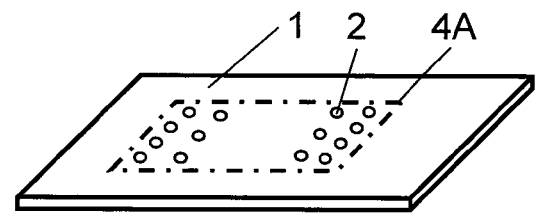
FIG. 4A is an appearance perspective view of a second example of a wiring board of the structure with electronic component mounted therein in accordance with the first exemplary embodiment of the present invention.
Figure 4B:
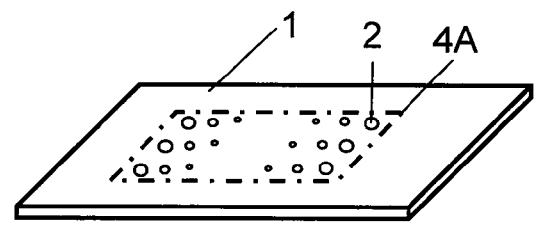
FIG. 4B is an appearance perspective view of a third example of the wiring board of the structure with electronic component mounted therein in accordance with the first exemplary embodiment of the present invention.

FIG. 4A is an appearance perspective view illustrating the second example of the wiring board of the mounting structure in the first exemplary embodiment of the present invention. FIG. 4B is an appearance perspective view illustrating the third example of wiring board of the mounting structure in the first exemplary embodiment of the present invention.

As shown in FIG. 4A, the number of holes 2 is increased from the center to outer periphery of region 4A corresponding to the mounting position of electronic component, in particular, in a longitudinal direction (long-side direction) of electronic component. In addition, as shown in FIG. 4B, the size of hole 2 is made larger from the center to outer periphery of region 4A corresponding to the mounting position of electronic component, in particular, in a longitudinal direction of electronic component.

This further effectively reduces a stress concentrated on the bonding section. In particular, warpage is greater in the longitudinal direction of electronic component, and thus a greater stress is applied. Accordingly, the stress is more effectively suppressed.

Figure 4C:
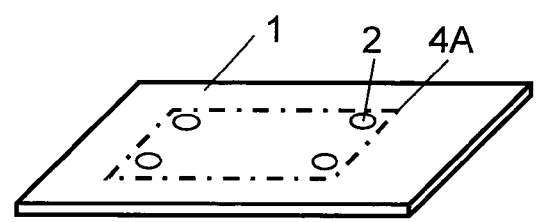
FIG. 4C is an appearance perspective view of a fourth example of the wiring board of the structure with electronic component mounted therein in accordance with the first exemplary embodiment of the present invention.
Figure 4D:
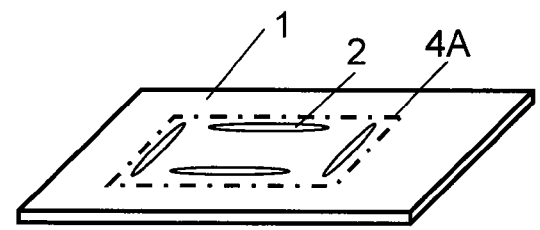
FIG. 4D is an appearance perspective view of a fifth example of the wiring board of the structure with electronic component mounted therein in accordance with the first exemplary embodiment of the present invention.

FIG. 4C is an appearance perspective view of the fourth example of the wiring board of the mounting structure in the first exemplary embodiment of the present invention. FIG. 4D is an appearance perspective view of the fifth example of the wiring board of the mounting structure in the first exemplary embodiment of the present invention.

As shown in FIG. 4C, holes 2 of the size larger than that indicated in the above exemplary embodiments are provided in region 4A corresponding to the mounting position of electronic component, in particular, in at least four corners of electronic component. Furthermore, as shown in FIG. 4D, oval or long holes 2, for example, are provided in region 4A corresponding to the mounting position of electronic component, in particular, along two pairs of opposing side faces of the electronic component. These holes significantly reduce a stress concentrated on the bonding section. In particular, this is effective when only a few numbers of wiring patterns are provided on the wiring board for connecting to an external component.

In this exemplary embodiment, holes are formed in the same shape from the first face to the second face of wiring board. However, the shape is not limited.

Figure 5A:
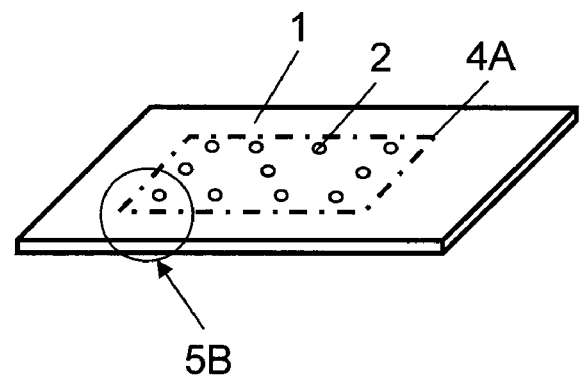
FIG. 5A is an appearance perspective view of another example of the wiring board of the structure with electronic component mounted therein in accordance with the first exemplary embodiment of the present invention.
Figure 5B:
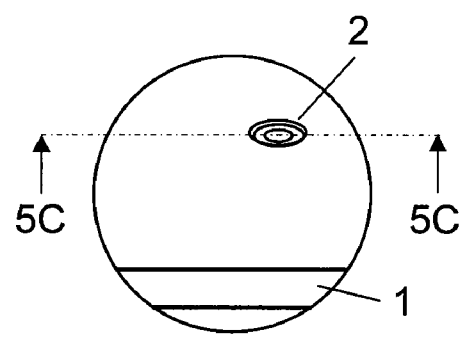
FIG. 5B is a magnified perspective view of part 5B in FIG. 5A.
Figure 5C:
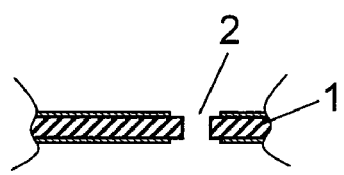
FIG. 5C is a sectional view taken along line 5C-5C in FIG. 5B.

Examples of hole shape is described below with reference to FIGS. 5A to 5C. FIG. 5A is an appearance perspective of another example of the wiring board of the mounting structure in the first exemplary embodiment of the present invention. FIG. 5B is a magnified perspective view of part 5B in FIG. 5A. FIG. 5C is a sectional view taken along line 5C-5C in FIG. 5B. In other words, as shown in FIGS. 5B and 5C, a cross-section of hole 2 has a step-like shape. The shape of hole 2 can be formed typically by cutting or forming an opening larger than the outline of hole at the center in resist covering the surface of wiring board.

This shape facilitates reliable filling of holes 2 with the resin.

(Second Exemplary Embodiment)

Figure 6A:
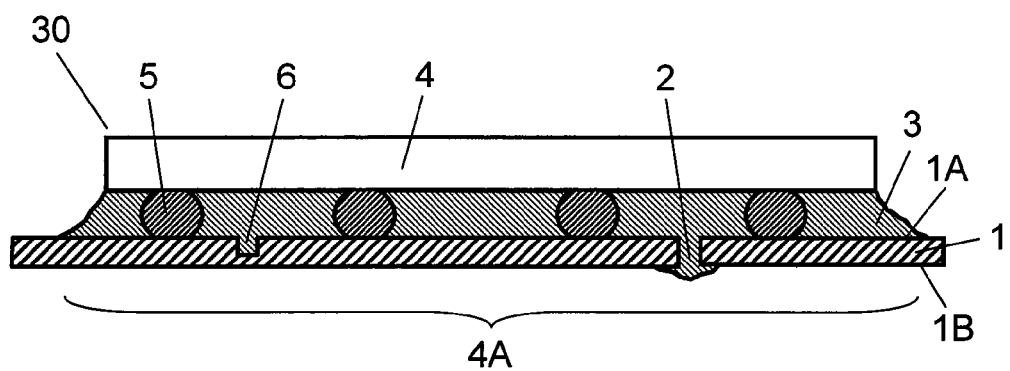
FIG. 6A is a sectional view of a structure with electronic component mounted therein in accordance with a second exemplary embodiment of the present invention.
Figure 6B:
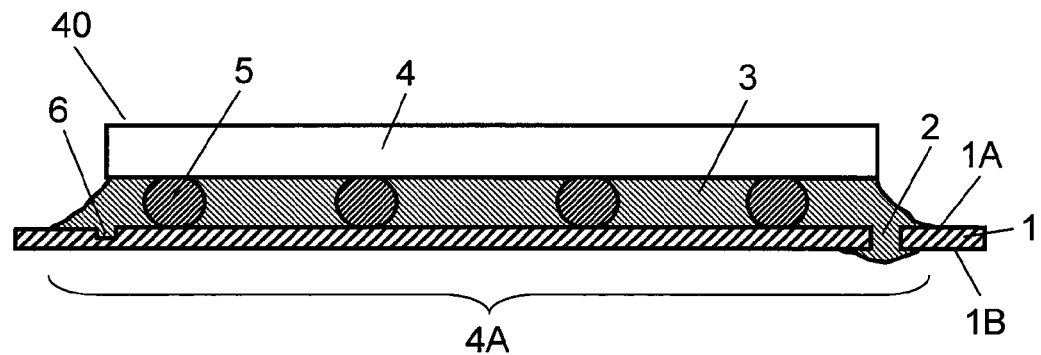
FIG. 6B is a sectional view of another example of the structure with electronic component mounted therein in accordance with the second exemplary embodiment of the present invention.

FIG. 6A is a sectional view illustrating configuration of a structure with electronic component mounted therein 30 (hereafter referred to as "mounting structure 30") in the second exemplary embodiment of the present invention. FIG. 6B is a sectional view illustrating configuration of a structure with electronic component mounted therein 40 (hereafter referred to as "mounting structure 40"), which is another example in the second exemplary embodiment of the present invention.

As shown in FIGS. 6A and 6B, some of a plurality of holes formed in wiring board 1 are cavities 6 that do not penetrate through to second face 1B of wiring board 1. This point differs from mounting structure 10 in the first exemplary embodiment and mounting structure 20 of the first example in the first exemplary embodiment.

More specifically, as shown in FIG. 6A, mounting structure 30 has a plurality of holes 2 penetrating through from first face 1A to second face 1B of wiring board 1, and a plurality of cavities 6 that are holes not penetrating through to second face 1B. Holes 2 and cavities 6 are filled with resin 3 for bonding electronic component 4 onto wiring board 1. Same as the first exemplary embodiment, resin 3 reaches second face 1B of wiring board 1, and protrudes to around hole 2.

As shown in FIG. 6B, mounting structure 40 has holes 2 penetrating through from first face 1A to second face 1B of wiring board 1 and cavities 6 not penetrating through near an outer edge of electronic component 4 in region 4A corresponding to a mounting position of electronic component 4. Region 4A includes an area where resin protrudes from the outer edge of electronic component 4, or an area where a fillet is formed.

The depth of cavity 6, which is a hole formed in wiring board 1, is about ½ or more of the thickness of wiring board 1. A volume of resin 3 protruding on second face 1B of wiring board 1 is not limited, but is preferably double or more of a diameter (size) of hole 2.

In this exemplary embodiment, a plurality of holes and cavities formed in the wiring board reduce a stress applied to a bonding section between the wiring board and the electronic component, same as the first exemplary embodiment. This achieves the mounting structure with high connection reliability. In addition, the resin filled in the holes penetrating through and cavities suppresses warpage of the mounting structure, achieving a thin mounting structure. When cavities are provided, the number of cavities is preferably greater than that of holes penetrating through. This increases an effect of suppressing the warpage.

This exemplary embodiment is particularly effective for wiring boards in which holes penetrating through cannot be formed due to wiring on the surface (second face) and an inner layer of the wiring board for external connection.

(Third Exemplary Embodiment)

Figure 7A:
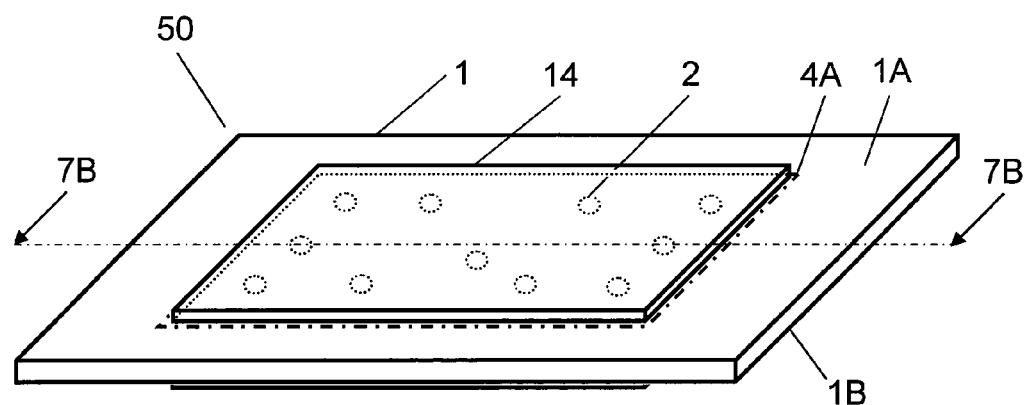
FIG. 7A is an appearance perspective view of a structure with electronic component mounted therein in accordance with a third exemplary embodiment of the present invention.
Figure 7B:
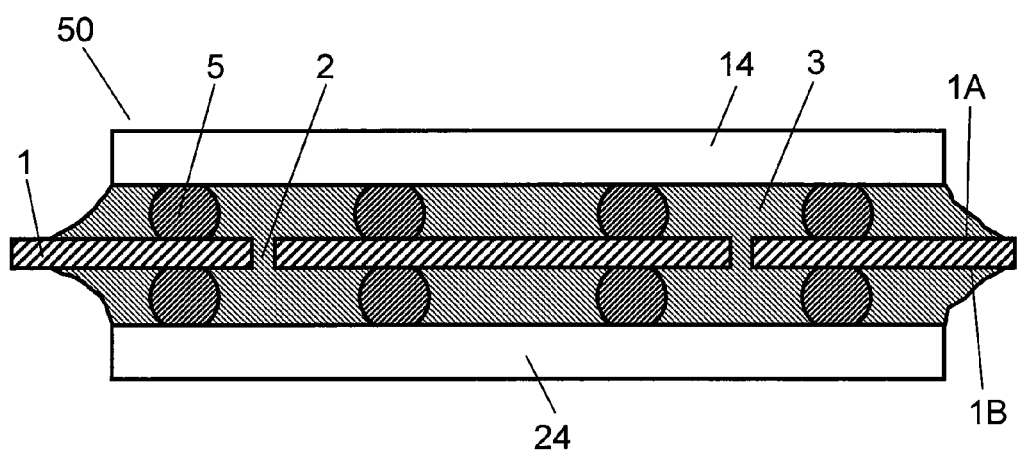
FIG. 7B is a sectional view taken along line 7B-7B in FIG. 7A.

FIG. 7A is an appearance perspective view illustrating configuration of a structure with electronic component mounted therein (hereafter referred to as "mounting structure") in the third exemplary embodiment of the present invention. FIG. 7B is a sectional view taken along line 7B-7B in FIG. 7A. For easier understanding, FIG. 7A is partially made transparent.

As shown in FIGS. 7A and 7B, an electronic component is further symmetrically provided on second face 1B of wiring board 1 at a position facing an electronic component mounted on first face 1A via wiring board 1. This point differs from mounting structure 10 in the first exemplary embodiment. In the following description, the electronic component provided on first face 1A of the wiring board is first electronic component 14, and the electronic component provided on second face 1B is second electronic component 24. Other components and materials are the same as that in the first exemplary embodiment, and thus their description may be omitted.

As shown in FIGS. 7A and 7B, mounting structure 50 includes first electronic component 14 mounted on first face 1A of wiring board 1, second electronic component 24 mounted on second face 1B, solder 5 for electrically connecting first electronic component 14 to wiring board 1 and second electronic component 24 to wiring board 1, and resin 3 for integrally bonding the electronic components via a plurality of holes 2 penetrating through. Resin 3 is what is generally called underfill resin. As shown in FIG. 7B, pads (not illustrated) of first electronic component 14 and second electronic component 24 are connected to electrodes (not illustrated) of wiring board 1 via solder 5 so as to electrically connect the electronic components to a wiring pattern (not illustrated) of wiring board 1.

Wiring board 1 has a plurality of holes 2 penetrating through from first face 1A to second face 1B of wiring board 1 in region 4A (indicated by a dot-dashed line in the drawing) corresponding to mounting positions of first electronic component 14 and second electronic component 24.

Resin 3 is filled between first electronic component 14 and wiring board 1 and between second electronic component 24 and wiring board 1. This integrates first electronic component 14 and wiring board 1, and second electronic component 24 and wiring board 1 via resin 3 in holes 2 to complete mounting structure 50.

The electronic components are mounted symmetrically with the wiring board in between, and they are integrated by the resin via a plurality of holes. As a result, warpage caused by a difference in thermal-expansion coefficients can be suppressed. In addition, provision of a plurality of holes 2 reduce a stress concentrated on a boundary face of solder 5, which is a bonding section between first electronic component 14 and wiring board 1 and between second electronic component 24 and wiring board 1.

Through holes may be used as holes. The resin filled in the through holes prevents peeling or disconnection of metal plating foils electrically connected via through holes, which may occur by expansion or shrinkage of the wiring board.

This exemplary embodiment reduces a stress applied to the bonding section between the wiring board and the electronic component by providing a plurality of holes in the wiring board. This achieves a mounting structure with good connection reliability. Still more, symmetrical mounting of electronic components on the wiring board suppresses warpage of the entire mounting structure, achieving a thin mounting structure.

Next, a method for manufacturing the mounting structure in the third exemplary embodiment of the present invention is described with reference to drawings.

FIGS. 8A to 8D are sectional views illustrating a method for manufacturing mounting structure 50 in the third exemplary embodiment of the present invention. FIG. 9 is a flow chart illustrating the method for manufacturing mounting structure 50 in the third exemplary embodiment of the present invention.

Figure 8A:
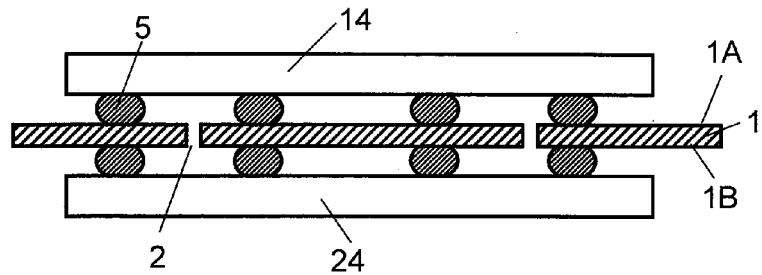
FIG. 8A is a sectional view illustrating a method for manufacturing the structure with electronic component therein in accordance with the third exemplary embodiment of the present invention.
Figure 9:
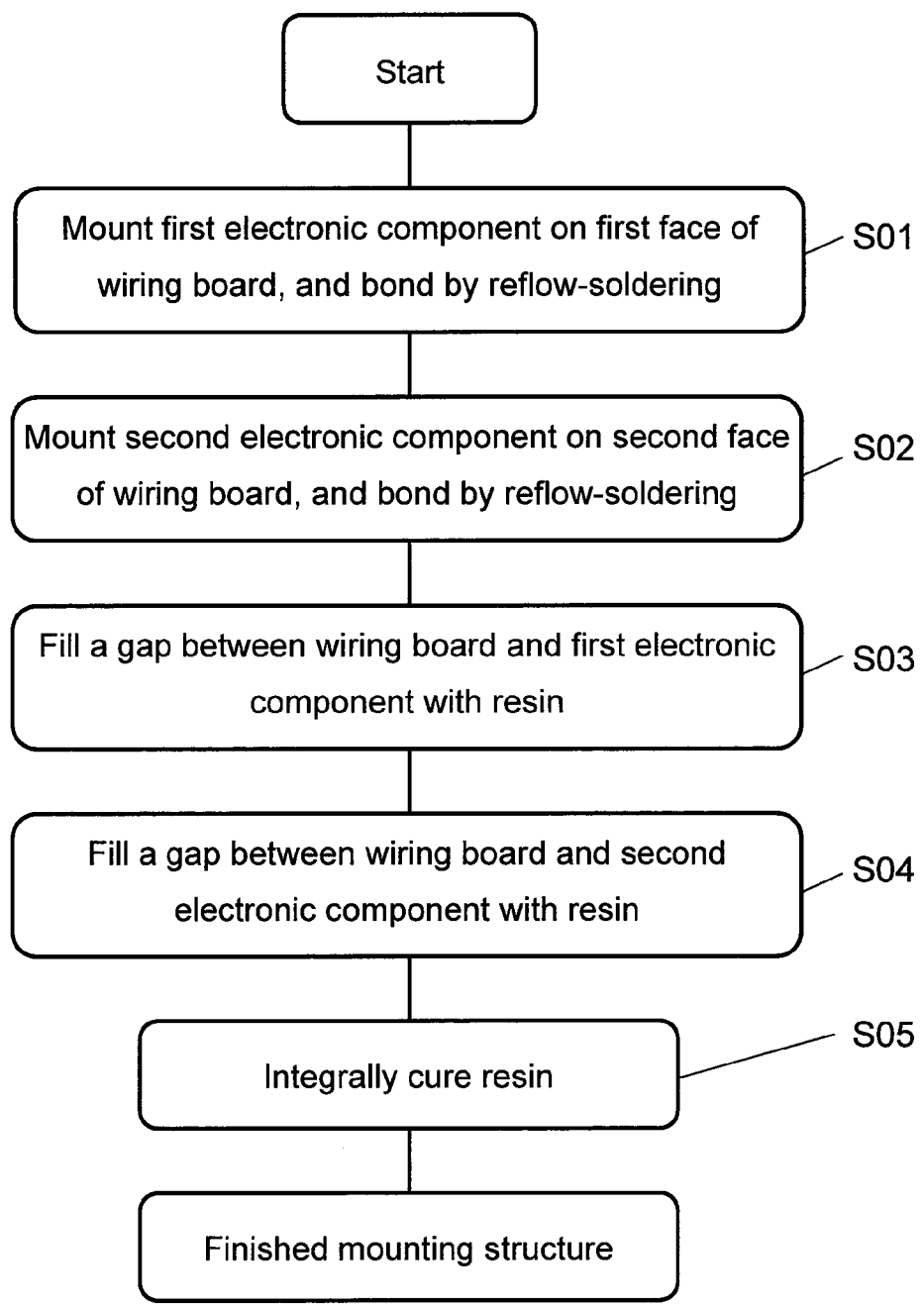
FIG. 9 is a flow chart of the method for manufacturing the structure in accordance with the third exemplary embodiment of the present invention.

First, as shown in FIGS. 8A and 9, holes 2 are formed in regions corresponding to mounting positions of first electronic component 14 and second electronic component 24 to be mounted in a later step on first face 1A and second face 1B of about 0.4 mm thick wiring board 1 typically made of a glass epoxy board. Holes 2 with outer diameter of 0.15 mm are formed typically by punching or laser beam. If through holes are used as holes 2, this process can be omitted.

Next, pads and wiring pattern (not illustrated) are formed typically by photo-lithography, deposition, or sputtering method.

Next, as required, at least wiring pattern is coated. Then, using photolithography method, an insulating film (not illustrated), such as resist is formed. As described in FIGS. 5A to 5C, the insulating film that has an opening with diameter larger than that of the hole or through hole is preferably formed around the pads and holes or through holes. This facilitates filling of the holes with the resin.

Next, solder paste made typically of Sn-3Ag.0.5Cu is applied to the pads on first face 1A of wiring board 1, typically by screen-printing, so as to form ball-shaped solder 5.

Then, an electrode (not illustrated) of first electronic component 14, such as a semiconductor chip, is positioned and placed on the pad of wiring board 1. First electronic component 14 is mounted and bonded onto first face 1A of wiring board 1 via solder 5 by reflow-soldering (Step S01).

In the same way, ball-shaped solder 5 is formed on the pad on second face 1B of wiring board 1, and an electrode (not illustrated) of second electronic component 24 is positioned and placed on the pad of wiring board 1. Second electronic component 24 is mounted and bonded onto second face 1B of wiring board 1 via solder 5 by reflow-soldering (Step S02).

Figure 8B:
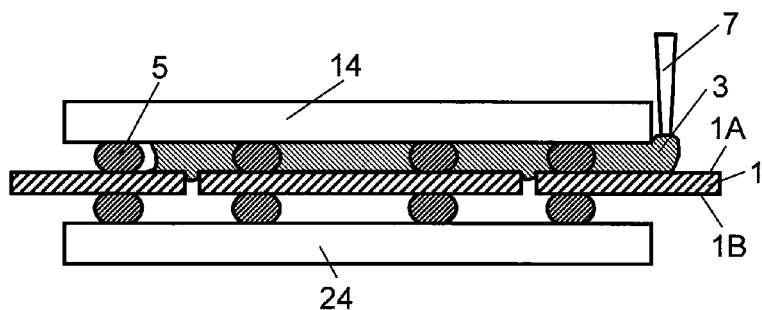
FIG. 8B is a sectional view illustrating the method for manufacturing the structure in accordance with the third exemplary embodiment of the present invention.

Next, as shown in FIGS. 8B and 9, resin 3, such as epoxy resin, is dripped and injected from around first electronic component 14 mounted on first face 1A of wiring board 1, using dispenser 7. In this way, resin 3 is injected such that it fills a gap between first electronic component 14 and first face 1A of wiring board 1 (Step S03). A part of injected resin 3 flows into holes 2, and may reach second face 1B, depending on a condition.

Figure 8C:
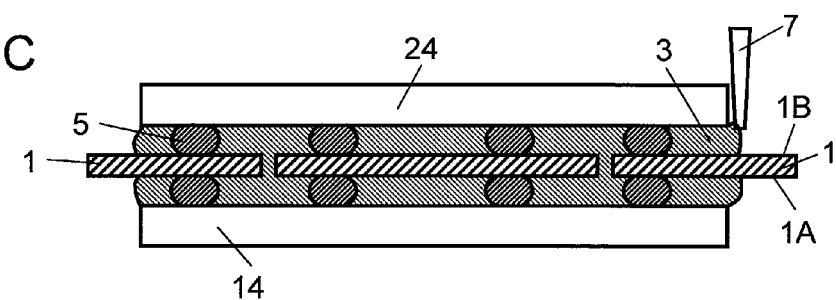
FIG. 8C is a sectional view illustrating the method for manufacturing the structure in accordance with the third exemplary embodiment of the present invention.

Next, as shown in FIGS. 8C and 9, wiring board 1 in which first electronic component 14 and second electronic component 24 are mounted and bonded is turned over to make second face 1B facing up. Then, as described in FIG. 8B, resin 3, such as epoxy resin, is dripped and injected from around second electronic component 24 mounted on second face 1B of wiring board 1, using dispenser 7. In this way, resin 3 is injected such that it fills a gap between second electronic component 24 and second face 1B of wiring board 1 (Step S04). Internal air is pushed out from resin inlet to resin outlet.

Figure 8D:
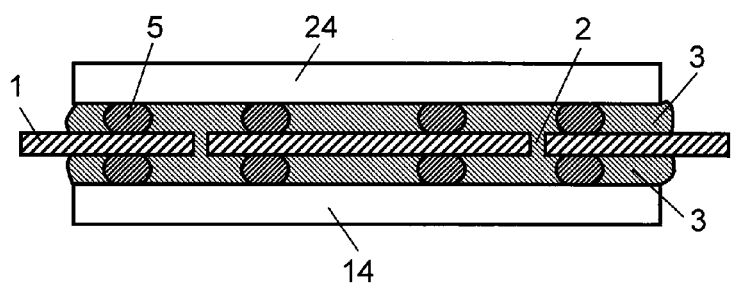
FIG. 8D is a sectional view illustrating the method for manufacturing the structure in accordance with the third exemplary embodiment of the present invention.

Next, as shown in FIGS. 8D and 9, heat treatment is applied at a predetermined temperature for curing resin 3 (e.g., about 150° C.), and resin 3 is integrally cured (Step S05). This completes mounting structure 50 in which first electronic component 14 is mounted on first face 1B and second electronic component 24 is mounted on second face 1B of wiring board 1.

In this exemplary embodiment, the first electronic component and the second electronic component are mounted on both first face and second face of the wiring board, and the resin is integrally cured via the holes. As a result, shrinkage of resin by curing acts in a direction of integrating the first electronic component and the second electronic component. This manufactures a highly-reliable mounting structure with further improved bonding strength. In addition, warpage of the wiring board caused by a difference in thermal-expansion coefficients of mounted components can be significantly suppressed by placing components symmetrically. Accordingly, a thin mounting structure can be achieved.

Another example of the mounting structure in the third exemplary embodiment of the present invention is described below with reference to FIGS. 10A and 10B.

Figure 10A:
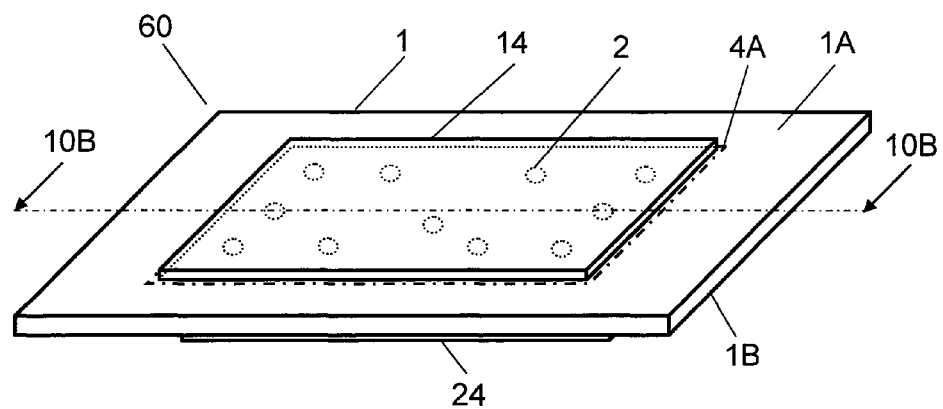
FIG. 10A is an appearance perspective view illustrating another example of the structure with electronic component mounted therein in accordance with the third exemplary embodiment of the present invention.

FIG. 10A is an appearance perspective view illustrating another example of mounting structure 60 in the third exemplary embodiment of the present invention. FIG. 10B is a sectional view taken along line 10B-10B in FIG. 10A. For easier understanding, FIG. 10A is also partially made transparent.

Figure 10B:
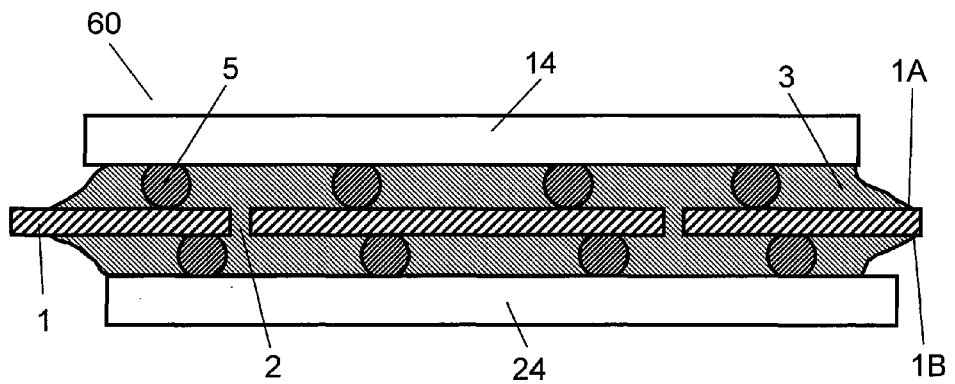
FIG. 10B is a sectional view taken along line 10B-10B in FIG. 10A.

As shown in FIGS. 10A and 10B, mounting positions of first electronic component 14 and second electronic component 24 mounted on first face 1A and second face 1B of wiring board 1 are deviated to break symmetrical arrangement. This point differs from aforementioned mounting structure 50. Other configuration, materials, and manufacturing methods are the same as that of mounting structure 50, and thus their description is omitted.

In this exemplary embodiment, a stress concentrated on a bonding section between the first electronic component and second electronic component and the wiring board can be suppressed even if the electronic components are not symmetrically mounted, as described later with reference to examples. Accordingly, highly-reliable mounting structure 60 is achievable.

(Fourth Exemplary Embodiment)

Figure 11:
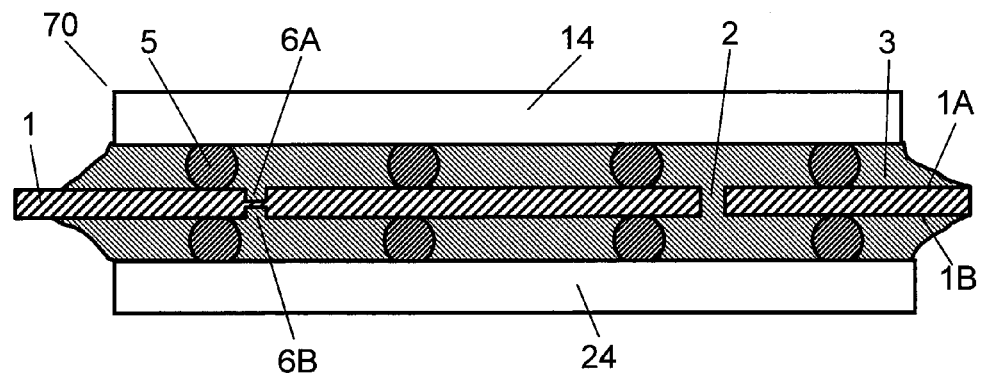
FIG. 11 is a sectional view of a structure with electronic component mounted therein in accordance with a fourth exemplary embodiment of the present invention.
Figure 12:
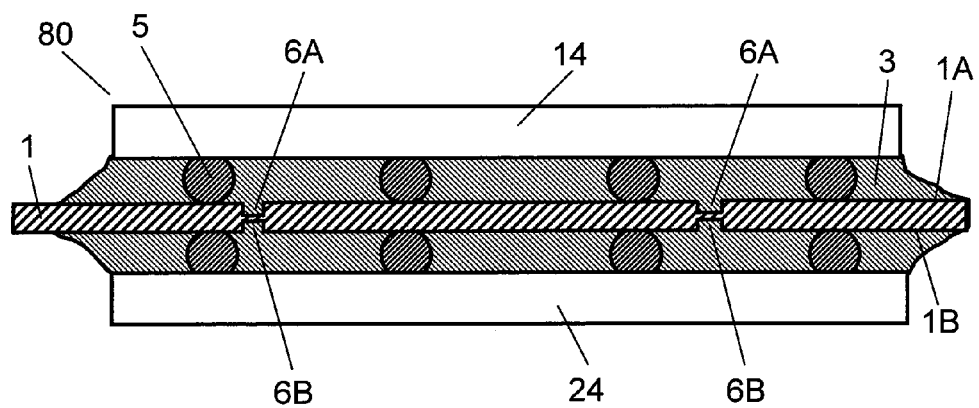
FIG. 12 is a sectional view of another example of the structure with electronic component mounted therein in accordance with the fourth exemplary embodiment of the present invention.

FIG. 11 is a sectional view illustrating configuration of a structure with electronic component mounted therein 70 (hereafter referred to as "mounting structure 70") in the fourth exemplary embodiment of the present invention. FIG. 12 is a sectional view illustrating configuration of another example of structure with electronic component mounted therein 80 (hereafter referred to as "mounting structure 80") in the fourth exemplary embodiment of the present invention.

As shown in FIGS. 11 and 12, a part of or all of a plurality of holes formed in wiring board 1 are cavities 6A not penetrating through to second face 1B and cavities 6B not penetrating through to first face 1A at corresponding positions on wiring board 1. This point differs from mounting structure 50 in the third exemplary embodiment.

More specifically, as shown in FIG. 11, mounting structure 70 has a plurality of holes 2 penetrating through from first face 1A to second face 1B of wiring board 1, and a plurality of cavities 6A not penetrating through to second face 1B in a region corresponding to the mounting position of first electronic component 14. In the same way, mounting structure 70 has a plurality of cavities 6B not penetrating through from second face 1B to first face 1A of wiring board 1 in a region corresponding to the mounting position of second electronic component 24. Holes 2 and cavities 6A and 6B are filled with resin 3 that bonds first electronic component 14 and second electronic component 24 onto wiring board 1.

As shown in FIG. 12, mounting structure 80 includes cavities 6A and 6B that do not penetrate through from first face 1A to second face 1B of wiring board 1. These cavities 6A and 6B face each other in regions corresponding to mounting positions of first electronic component 14 and second electronic component 24. Aforementioned regions include an area where resin 3 protrudes from outer edge of first electronic component 14 or second electronic component 24, or an area where a fillet is formed.

A depth of cavities 6A and 6B, which are holes formed in wiring board 1, is preferably less than ½ of the thickness of wiring board 1. If cavity 6A and cavity 6B are not provided at positions facing each other, their depth may be ½ or more.

In this exemplary embodiment, same as other exemplary embodiments, a plurality of holes and cavities formed in the wiring board reduce a stress applied to bonding sections between the wiring board and the first electronic component and second electronic component, and achieve the mounting structure with good connection reliability. In addition, rigidity of the wiring board can be changed by the resin filled in the holes penetrating through and cavities, so as to suppress warpage of the mounting structure. This achieves a thin mounting structure. If the cavities are provided, the number of cavities is preferably greater than that of holes penetrating through, in order to increase the effect of warpage suppression.

This exemplary embodiment is particularly effective for wiring boards in which holes penetrating through cannot be formed because wiring on an inner layer of the wiring board, such as a multilayer board, is used for external connection.

The above exemplary embodiment refers to an example of providing cavities facing each other on the first face and the second face of the wiring board. However, this exemplary embodiment is not limited to this arrangement. The cavities may not be facing each other.

Still more, the above exemplary embodiment refers to an example of the first electronic component and the second electronic component having the same shape. However, the shapes may be different. In that case, many cavities are preferably formed in a region corresponding to a larger electronic component.

(Fifth Exemplary Embodiment)

Figure 13:
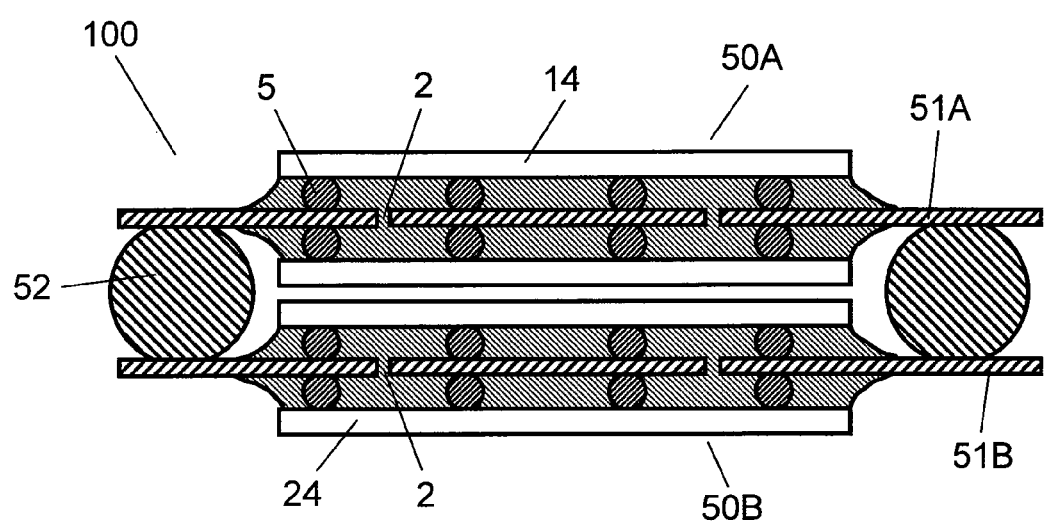
FIG. 13 is a sectional view of a structure with electronic component mounted therein in accordance with a fifth exemplary embodiment of the present invention.

FIG. 13 is a sectional view of configuration of a structure with electronic component mounted therein (hereafter referred to as "mounting structure") in the fifth exemplary embodiment of the present invention.

As shown in FIG. 13, mounting structure 100 is configured by laminating two mounting structures 50 described in the third exemplary embodiment.

More specifically, as shown in FIG. 13, in mounting structure 100, wiring board 51A extending outward from first mounting structure 50A and wiring board 51B extending outward from second mounting structure 50B are laminated via, for example, ball-shaped connecting member 52. Connecting member 52 may be formed by mounting a ball or selectively formed using a dispenser. An important point in forming connecting member 52 is that connecting member 52 provides a distance that avoids contact of first mounting structure 50A and second mounting structure 50B. Therefore, a ball-shaped connecting member made of metal particles, such as Cu, Ni, Fe, Co, and Al, coated with solder to a predetermined size is preferably used.

This exemplary embodiment achieves thin mounting structure 100 that facilitates high-performance design and high-density mounting by laminating a plurality of mounting structures with small warpage.

This exemplary embodiment refers to lamination of two mounting structures. However, any number of structures can be laminated as required. This achieves a high-density mounting structure for a required purpose.

Still more, the exemplary embodiment refers to an example of laminating the structures via only a connecting member. However, this is not limited. For example, resin may be filled between the structures to be laminated. This improves the mechanical strength of the mounting structure, increasing reliability.

Still more, the exemplary embodiment refers to an example of laminating mounting structures 50 in the third exemplary embodiment. However, this is not limited. Any mounting structure described in the exemplary embodiments may be combined, as required, and laminated. This increases the flexibility in design of mounting structure.

Still more, the exemplary embodiment refers to an example of ball-shaped connecting member. However, this is not limited. For example, a cylindrical, prismatic, or frame-shaped connecting member may be used. In this case, the connecting member is provided along the outer periphery of wiring board, and preferably connects the mounting structures by typically forming a strip of electrodes corresponding to an electrode pattern provided on the wiring board.

Examples described in the first exemplary embodiment are applicable to each of the above exemplary embodiments.

Furthermore, each exemplary embodiment refers to an example of filling the resin between the wiring board and the electronic component. However, this is not limited. For example, at least a mounted electronic component may be entirely molded with resin. This improves the bonding strength between the electronic component and the wiring board, and the mechanical strength of the mounting structure. A resin material used for molding may be the same or of the same nature as that used for underfill. Resin with small thermal-expansion coefficient and small fluidity may also be used. In addition, molding resin may be cured at the same time as underfill resin, or molding resin may be applied and cured after curing the underfill resin.

Next, an effect of each exemplary embodiment is described based on a specific example of a mounting structure manufactured in accordance with each exemplary embodiment of the present invention.

EXAMPLE 1

In Example 1, mounting structure 10 is manufactured based on the third exemplary embodiment.

First, a four-layer glass epoxy board (thickness: 0.4 mm) made of epoxy resin with high Tg (glass-transition temperature) not less than 150° C. is used as a wiring board in order to achieve low linear expansion coefficient. As holes penetrating though, 12 through-holes with 0.15 mm diameter formed previously in a region where no wiring pattern exists on the wiring board are used.

As the first electronic component and the second electronic component, LGA-type semiconductor packages with outer dimensions of 12×17 mm and thickness of 1 mm are used. A land diameter is 1 mm.

Then, the first electronic component and the second electronic component are mounted symmetrically on the wiring board, via solder, with the wiring board in between. Solder paste of Sn-3Ag.0.5Cu (e.g., M705 by Senju Metal Industry Co., Ltd.) is used as solder, and is printed using a printing mask (e.g., by Mesh Corporation) in a thickness of 0.12 mm.

As resin, epoxy adhesive (e.g., by Namics Corporation) sealed in a 50-cc syringe is used. The coefficient of elasticity of resin is 3 GPa, and glass-transition temperature is 150° C., measured by dynamic viscoelasticity. Average resin particle size is 2 μm and filler content rate is 55%. The resin injection amount is 25 mg in a center value per electronic component.

A mounting structure is manufactured using the above components and materials based on the manufacturing method described with reference to FIGS. 8A to 8D and FIG. 9 in the third exemplary embodiment. This is called Sample 1.

EXAMPLE 2

Example 2 uses a both-sided wiring flexible board made of a polyimide substrate with total thickness of 0.15 mm as the wiring board. Other than this point, a mounting structure is manufactured using the same configuration and manufacturing method as that in Example 1. This is called Sample 2.

EXAMPLE 3

Example 3 uses a general-purpose glass epoxy multilayer board (FR-4) with total thickness of 0.8 mm as the wiring board. The glass—transition temperature of this wiring board is 120° C., measured by dynamic viscoelasticity. Other than the wiring board, a mounting structure is manufactured using the same configuration and manufacturing method as that in Example 1. This is called Sample 3.

EXAMPLE 4

In example 4, mounting structure 60 is manufactured based on another example in the third exemplary embodiment.

The second electronic component on the second face of the wiring board is deviated for half pitch of each electrode in the X-Y direction, relative to the mounting position of the first electronic component mounted on the first face. More specifically, the second electronic component is deviated for 0.5 mm in the X-Y direction. Other than this point, a mounting structure is manufactured using the same configuration and manufacturing method as that in Example 1. This is called Sample 4.

EXAMPLE 5

In Example 5, mounting structure 100 is manufactured based on the fifth exemplary embodiment.

The mounting structures manufactured in Example 1 are bonded via a connecting member made of solder ball so as to manufacture two-structure laminated mounting structure. This is called Sample 5.

Comparative Example 1 to Comparative Example 5

Comparative Example 1 to Comparative Example 5 use a wiring board without holes. Other than this point, mounting structures are manufactured using the same method as Example 1 to Example 5. They are called Sample C1 to Sample C5.

Mounting structures manufactured using the above methods are evaluated based on a reliability test, which is a heat cycle test described below. The number of samples evaluated is N=3.

Conditions for the heat-cycle test are temperature range of −40° C. to 115° C. and retention time of 60 minutes. This is considered as one cycle, and the test is implemented by repeating this cycle. After every 100 cycles, each sample is taken out from a test chamber, and its resistance is measured. Based on this resistance, occurrence of disconnection in each sample is determined. The number of cycles up to disconnection is considered as a life time, and each sample is evaluated based on the number of cycles in a sample with the shortest life time, and the number of cycles in average life time of N=3 samples.

Sample 1 to Sample 5 and Sample C1 to Sample C5 are compared. Table 1 shows specifications and evaluation results.

TABLE 1

| | Specifications | | | Evaluation results | |
|---|---|---|---|---|---|
| No. | Material of wiring board | Characteristic | Holes | Number of cycles in the shortest life time | Number of cycles in average life time |
| Sample 1 | Glass epoxy | High-Tg board | Yes | 1300 | 1300 |
| Sample C1 | | | No | 1100 | 1100 |
| Sample 2 | Polyimide | Flexible board | Yes | 700 | 770 |
| Sample C2 | | | No | 600 | 650 |
| Sample 3 | Glass epoxy | Multilayer board (FR-4) | Yes | 700 | 730 |
| Sample C3 | | | No | 600 | 630 |
| Sample 4 | Glass epoxy | Electronic components are positionally deviated | Yes | 1000 | 1000 |
| Sample C4 | | | No | 900 | 950 |
| Sample 5 | Glass epoxy | Two-structure lamination | Yes | 1000 | 1000 |
| Sample C5 | | | No | 600 | 650 |

When comparing Sample 1 to Sample 5 and Sample C1 to Sample C5, as shown in Table 1, it is apparent that the number of cycles in the shortest life time extends by forming holes in a wiring board. In all samples evaluated, disconnection is caused by a crack in a solder portion where the wiring board and electronic component are connected.

Comparison of Sample 1, Sample 2, and Sample 3 reveals that the mounting structure using the wiring board of Sample 1, which is high Tg-type board with low thermal-expansion coefficient, achieves good number of cycles. It can be assumed that a stress concentrated during the heat cycle is suppressed by the wiring board with low thermal-expansion coefficient.

Comparison of Sample 2 and Sample 3 reveals that the number of cycles is slightly better in Sample 2 that uses a flexible board with high flexibility. It can be assumed that a difference in flexibility of wiring boards results in easier response to expansion and shrinkage of resin.

Comparison of Sample 4 and Sample C4 reveals that the number of cycles is increased, and thus the life time can be extended by forming holes in the wiring board, although the first electronic component and the second electronic component are mounted on the first face and the second face of the wiring board at deviated positions from each other. However, Comparison of Sample 1 and Sample 4 reveals that symmetrical placement of electronic components on both faces of the wiring board is more preferable with respect to the life time. It can be assumed that a stress concentrated on the bonding section increases when placement positions are deviated.

Comparison of Sample 5 and Sample C5 reveals that the number of cycles can also be increased even in a multilayer mounting structure by forming holes in the wiring board. The number of cycles of Sample C5 is far lower than the number of cycles of Sample 5. It can be assumed that warpage and concentrated stress in each mounting structure are added and cause larger influence when the mounting structures are laminated.

Next, the mounting structures manufactured based on the manufacturing methods in the exemplary embodiments of the present invention and a mounting structure manufactured based on a conventional manufacturing method are described with reference to Example 6 and Comparative Example 6.

EXAMPLE 6

In Example 6, a mounting structure is manufactured based on a manufacturing method described with reference to FIGS. 8A to 8D and FIG. 9 in the third exemplary embodiment.

First, as a wiring board, 0.8 mm thick glass epoxy board with a plurality of holes (e.g., 12 holes) is used. Then, the first electronic component and the second electronic component, which are BGA-type semiconductor chips of 15 mm square, are mounted and bonded via solder by reflow-soldering Next, resin is filled, using a dispenser (e.g., by Musashi Engineering Inc.), between the first electronic component and second electronic component and the wiring board. Here, epoxy adhesive (e.g., by Namics Corporation) sealed in a 100-cc syringe is used as resin. A resin injection amount is 40 mg in a center value per electronic component.

Next, the resin is thermally treated at 150° C. for 15 minutes and cured, using a batch-type temperature-controlled heater oven (e.g., by Yamato Scientific Co., Ltd.).

A mounting structure is manufactured as described above. This is called Sample 6.

Comparative Example 6

Figure 14:
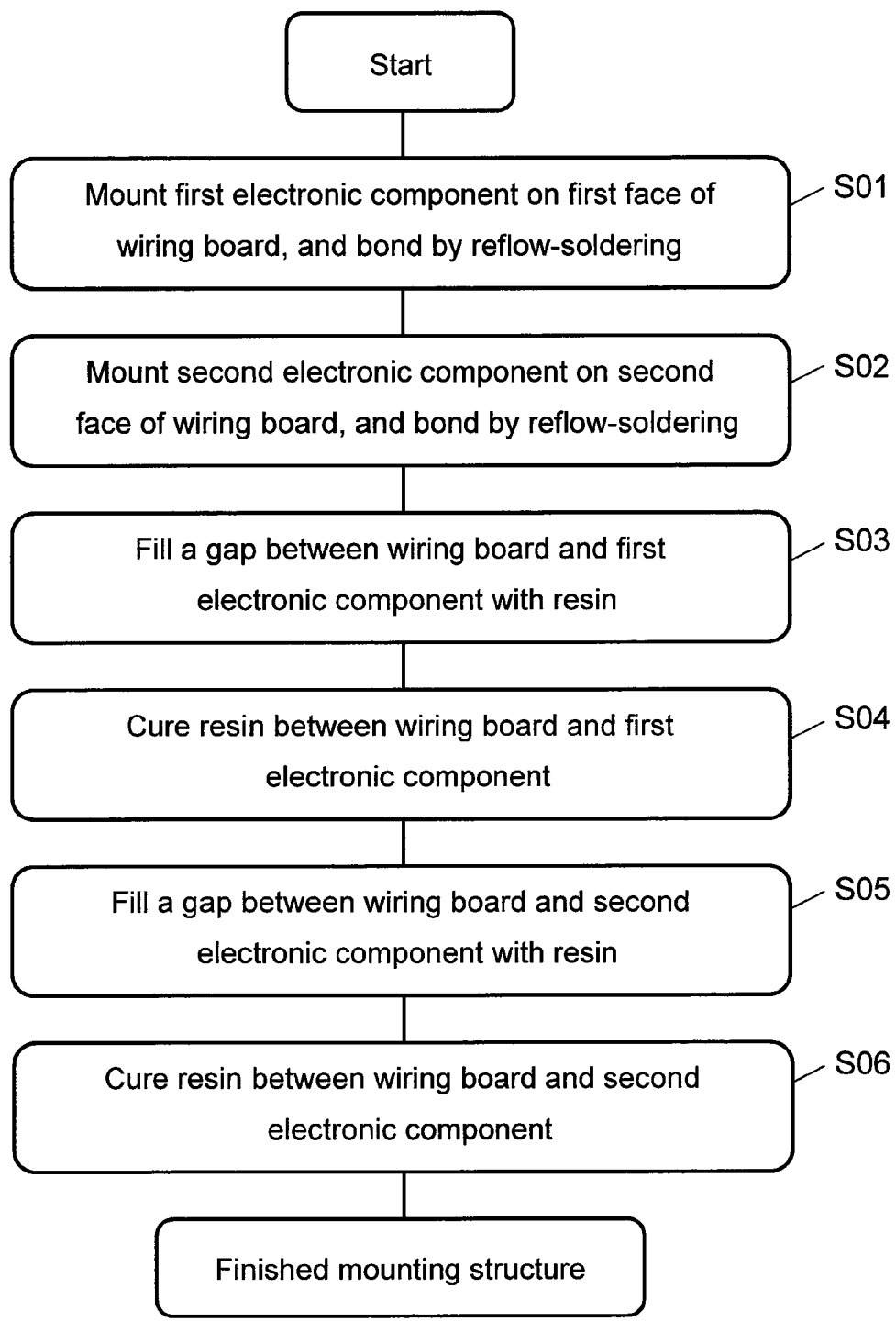
FIG. 14 is a flow chart illustrating a method for manufacturing a structure with electronic component mounted therein in accordance with Comparative example 6.

As Comparative Example 6, a mounting structure is manufactured based on a manufacturing method shown in a flow chart in FIG. 14.

Comparative Example 6 uses a resin curing method different from Example 6, but other configuration is the same.

More specifically, the first electronic component and the second electronic component are mounted and bonded on the first face and the second face of the wiring board via solder by reflow-soldering.

Then, after injecting resin between the first electronic component and the wiring board (Step S03), the resin is cured using a batch-type temperature-controlled heater oven (Step S04).

Next, after injecting resin between the second electronic component and the wiring board (Step S05), the resin is cured using the batch-type temperature-controlled heater oven (Step 506).

A mounting structure is manufactured as described above. This is called Sample C6.

Sample 6 and Sample C6 are compared and evaluated for N-3 pieces based on the state of resin fillet formation.

As a result, good fillet is formed around the electronic component in all mounting structures in Samples 6. On the other hand, fillet is not uniformly formed in Samples C6.

It can be assumed that this is caused by the resin protruding to the second face of the wiring board while the resin filled between the first electronic component and the wiring board is cured.

Based on the above results, good fillet can be formed by simultaneously curing the resin filled between the first electronic component and the second electronic component and the wiring board.

In each of the above examples, the mounting structures in the first exemplary embodiment and the second exemplary embodiment are not specifically described. However, results same as Example 1 to Example 6 are obtained.

INDUSTRIAL APPLICABILITY

A structure with electronic component mounted therein and a method for manufacturing such structure of the present invention are effectively applicable to technical fields of mobile phones, mobile digital devices, and digital home appliances that are increasingly downsized, slimmed, and multi-functioned.

The invention claimed is:

1. A structure with electronic component mounted therein, comprising:
   a wiring board on which an electronic component is mounted on a first face by way of a connection part;
   resin provided between the electronic component and the wiring board; and
   a plurality of through-holes provided in a projection area of the electronic component on the wiring board,
   wherein the electronic component is not mounted in a region of the plurality of through-holes on a second face opposite to the first face of the wiring board,
   the resin fills in the plurality of through-holes, and is formed only up to the periphery of the plurality of through-holes on the second face, and
   the plurality of through-holes are provided on the outer circumference of the connection part.

2. The structure with electronic component mounted therein of claim 1, wherein a cross-section of the through-holes has a step-like shape.

3. The structure with electronic component mounted therein of claim 1, wherein the number of the through-holes is increased from a center to an outer periphery of the region corresponding to the mounting position of the electronic component.

4. The structure with electronic component mounted therein of claim 1, wherein a shape of the through-holes is made larger from a center to an outer periphery of the region corresponding to the mounting position of the electronic component.

5. The structure with electronic component mounted therein of claim 1, wherein the resin contains filler, the filler having a maximum particle size not greater than half of a hole size of the through-holes in the wiring board.

6. The structure with electronic component mounted therein of claim 1, wherein a coefficient of elasticity of the resin is smaller than a coefficient of elasticity of the wiring board.

7. The structure with electronic component mounted therein of claim 1, wherein a glass-transition temperature of the resin is lower than a glass-transition temperature of the wiring board.

8. The structure with electronic component mounted therein of claim 1, wherein the wiring board is a flexible board.

9. The structure with electronic component mounted therein of claim 1, wherein at least the electronic component is molded with resin of a same nature as the resin.

10. A structure with electronic component mounted therein, comprising a plurality of the structures with electronic component mounted therein of claim 1, the structures being laminated to form a module.

11. A method for manufacturing a structure with electronic component mounted therein, comprising:
    forming a plurality of through-holes in a region corresponding to a mounting position of an electronic component on a wiring board, at positions at an outer side from a connection part of the electronic component and the wiring board;
    mounting the electronic component on a first face of the wiring board in the region corresponding to the mounting position of the electronic component; and
    applying resin between the electronic component and the wiring board, and filling the through-holes with the resin, and further forming up to the periphery of the through-holes on a face of the wiring board in which the electronic component is not disposed.

12. The method for manufacturing a structure with electronic component mounted therein of claim 11, wherein a cross-section of the through-holes has a step-like shape.

13. The method for manufacturing a structure with electronic component mounted therein of claim 11, wherein the number of the through-holes is increased from a center to an outer periphery of the region corresponding to the mounting position of the electronic component.

14. The method for manufacturing a structure with electronic component mounted therein of claim 11, wherein a shape of the through-holes is made larger from a center to an outer periphery of the region corresponding to the mounting position of the electronic component.

* * * * *